(12) United States Patent
Yang et al.

(10) Patent No.: US 10,580,836 B2
(45) Date of Patent: Mar. 3, 2020

(54) OLED TOUCH DISPLAY PANEL WITH BAFFLES ON A TFT BACK PLATE, METHOD FOR MANUFACTURING THE SAME AND TOUCH DISPLAY DEVICE

(71) Applicant: BOE Technology Group Co., Ltd., Beijing (CN)

(72) Inventors: Shengji Yang, Beijing (CN); Xue Dong, Beijing (CN); Xiaochuan Chen, Beijing (CN); Minghua Xuan, Beijing (CN); Pengcheng Lu, Beijing (CN); Weifeng Han, Beijing (CN); Huijuan Wang, Beijing (CN); Jing Yu, Beijing (CN); Yingli Liu, Beijing (CN); Limin Yu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 16/074,323

(22) PCT Filed: Jan. 3, 2018

(86) PCT No.: PCT/CN2018/070079
§ 371 (c)(1),
(2) Date: Jul. 31, 2018

(87) PCT Pub. No.: WO2018/205651
PCT Pub. Date: Nov. 15, 2018

(65) Prior Publication Data
US 2019/0326359 A1  Oct. 24, 2019

(30) Foreign Application Priority Data
May 10, 2017  (CN) .......................... 2017 1 0328928

(51) Int. Cl.
*H01L 27/32* (2006.01)
*G06F 3/041* (2006.01)
(Continued)

(52) U.S. Cl.
CPC ............ *H01L 27/323* (2013.01); *G06F 3/044* (2013.01); *G06F 3/0412* (2013.01);
(Continued)

(58) Field of Classification Search
CPC . G06F 2203/04102; G06F 2203/04103; G06F 2203/04112
See application file for complete search history.

(56) References Cited

U.S. PATENT DOCUMENTS

| 2003/0103176 A1* | 6/2003 | Abe | ...................... G02F 1/1362 349/113 |
| 2009/0081356 A1* | 3/2009 | Fedorovskaya | ....... C23C 16/403 427/66 |

(Continued)

FOREIGN PATENT DOCUMENTS

| CN | 103887324 | 6/2014 |
| CN | 105182588 | 12/2015 |

(Continued)

OTHER PUBLICATIONS

Chinese Office Action Corresponding to Chinese Patent Application No. 201710328928.6 (Foreign Text, 8 Pages, English Translation Thereof, 8 Pages) (dated Jan. 18, 2019).
(Continued)

*Primary Examiner* — Chun-Nan Lin
(74) *Attorney, Agent, or Firm* — Myers Bigel, P.A.

(57) ABSTRACT

An OLED touch display panel, a method for manufacturing an OLED touch display panel and a touch display device are disclosed. The method comprises: forming a plurality of baffles by a patterning process on a TFT back plate, wherein
(Continued)

each of the baffles defines a touch region; and forming a cathode layer on the TFT back plate on which the baffles have been formed. The cathode layer is partitioned by the baffles into a plurality of self-capacitance electrodes insulated from each other. Each of the self-capacitance electrodes is located within one of the touch regions and matches the touch region in shape.

14 Claims, 8 Drawing Sheets

(51) Int. Cl.
    *G06F 3/044* (2006.01)
    *H01L 51/52* (2006.01)
(52) U.S. Cl.
    CPC ...... *H01L 27/3211* (2013.01); *H01L 27/3246* (2013.01); *H01L 27/3276* (2013.01); *H01L 51/5225* (2013.01); *H01L 51/5265* (2013.01); *G06F 2203/04103* (2013.01); *H01L 2227/323* (2013.01)

(56) References Cited

U.S. PATENT DOCUMENTS

| | | | | |
|---|---|---|---|---|
| 2011/0043464 | A1* | 2/2011 | Lee | G06F 3/042 345/173 |
| 2015/0323483 | A1* | 11/2015 | Liu | C23C 14/545 118/712 |
| 2016/0236973 | A1* | 8/2016 | Li | C03C 15/00 |
| 2016/0291761 | A1* | 10/2016 | Huie | G06F 3/0414 |
| 2017/0075452 | A1* | 3/2017 | Kim | G06F 3/044 |
| 2017/0115818 | A1* | 4/2017 | Cai | G06F 3/044 |
| 2018/0011573 | A1* | 1/2018 | Yu | G02F 1/133345 |
| 2018/0026225 | A1* | 1/2018 | Kwon | H01L 51/5237 257/40 |

FOREIGN PATENT DOCUMENTS

| | | |
|---|---|---|
| CN | 205121533 | 3/2016 |
| CN | 105974629 | 9/2016 |
| CN | 106252526 | 12/2016 |
| CN | 106484202 | 3/2017 |
| CN | 206058164 | 3/2017 |
| CN | 107123621 | 9/2017 |
| CN | 107168574 | 9/2017 |

OTHER PUBLICATIONS

Chinese Office Action Corresponding to Chinese Patent Application No. 201710328928.6 (Foreign Text, 7 Pages, English Translation Thereof, 7 Pages) (dated Jul. 6, 2018).

International Search Report and the Written Opinion of the International Searching Authority in corresponding PCT Application No. PCT/CN2018/070079 (Foreign Text, 12 Pages, English Translation of Written Opinion, 4 Pages) (dated Mar. 30, 2018).

* cited by examiner

OLED TOUCH DISPLAY PANEL WITH BAFFLES ON A TFT BACK PLATE, METHOD FOR MANUFACTURING THE SAME AND TOUCH DISPLAY DEVICE

CROSS REFERENCE TO RELATED APPLICATIONS

The present application is a 35 U.S.C. § 371 national stage application of PCT International Application No. PCT/CN2018/070079, filed on Jan. 3, 2018, which claims the priority of Chinese patent application No. 201710328928.6 filed on May 10, 2017, the contents of which are incorporated herein by reference in their entireties.

TECHNICAL FIELD

This disclosure relates to the field of display technologies, and in particular to an OLED touch display panel, a method for manufacturing an OLED touch display panel and a touch display device.

BACKGROUND

Active matrix organic light emitting diode (AMOLED) displays have advantages of low manufacturing costs, fast response speed, low power consumption, DC drive applicable to portable devices, and a large range of operation temperatures, etc., and hence are expected to be the next generation of new type flat displays replacing liquid crystal displays (LCDs). In particular, flexible AMOLEDs are attracting more and more attention on the market since they are light, thin, bendable or collapsible, and arbitrarily variable in shape.

An AMOLED usually needs an encapsulation cover plate as a barrier to water and oxygen. The encapsulation cover plate is manufactured normally through a glass cover plate process or a thin film encapsulation (TFE) process. When adopting the TFE process, normally, a Multi-Layer-On-Cell touch structure is directly manufactured on a thin film encapsulation structure, which, for example, has been adopted in a cell phone of Galaxy S6 made by Samsung. However, the Multi-Layer-On-Cell touch structure involves complicated manufacture processes and higher costs.

SUMMARY

In an aspect of the embodiments of this disclosure, it is provided a method for manufacturing an OLED touch display panel, comprising: forming a plurality of baffles by a patterning process on a TFT back plate, wherein each of the baffles defines a touch region; and forming a cathode layer on the TFT back plate on which the baffles have been formed, wherein the cathode layer is partitioned by the baffles into a plurality of self-capacitance electrodes insulated from each other, and each of the self-capacitance electrodes is located within one of the touch regions and matches the touch region in shape.

In an embodiment, the method further comprises: forming on the TFT back plate a plurality of spacers located within the touch regions.

In an embodiment, the method further comprises: forming the spacers and the baffles by one patterning process, and by means of a negative photoresist.

In an embodiment, the step of forming on the TFT back plate the plurality of spacers located within the touch regions comprises: forming on the TFT back plate a plurality of first sub-spacers and a plurality of second sub-spacers located within the touch regions, wherein the plurality of first sub-spacers are arranged in a form of a matrix, and the second sub-spacers are located between two adjacent rows and two adjacent columns of first sub-spacers; and wherein an extension direction of the first sub-spacers is perpendicular to an extension direction of the second sub-spacers.

In an embodiment, the method further comprises: forming a via hole in a position in the self-capacitance electrode corresponding to the spacer, wherein the spacer passes through the via hole.

In an embodiment, the step of forming the plurality of baffles by the patterning process further comprises: defining for each baffle a lead region connected with the touch region defined by the same baffle, wherein the lead region extends to a non-display region of the OLED touch display panel.

In an embodiment, the method further comprises: partitioning the cathode layer into a plurality of touch leads insulated from each other by means of the baffles while forming the self-capacitance electrodes, wherein each of the touch leads is located within one of the lead regions and matches the lead region in shape; and wherein the touch leads partitioned by a same baffle are electrically connected with the self-capacitance electrode.

In an embodiment, the method further comprises: prior to forming the baffles on the TFT back plate, forming a pixel definition layer on the TFT back plate by a patterning process, wherein the pixel definition layer comprises pixel partitions crossing each other transversely and longitudinally and an opening enclosed by the pixel partitions.

In an embodiment, the step of forming the baffles comprises: forming the baffles on a side of the pixel partitions facing away from the TFT back plate.

In an embodiment, the method further comprises: prior to forming the cathode layer, sequentially forming a hole injection layer and a hole transport layer completely covering a display region of the TFT back plate by a patterning process on the TFT back plate on which the pixel partitions have been formed; forming an organic light emitting layer in a position corresponding to the opening by a patterning process on the TFT back plate on which the hole transport layer has been formed; and forming an electron transport layer completely covering the display region of the TFT back plate by a patterning process on the TFT back plate on which the organic light emitting layer has been formed.

In an embodiment, the method further comprises: prior to forming the organic light emitting layer, forming a padding layer for adjusting a height of a microcavity in a position corresponding to the opening by a patterning process on the TFT back plate on which the hole transport layer has been formed; and forming a buffer layer completely covering the display region of the TFT back plate by a patterning process on the TFT back plate on which the padding layer has been formed.

In an embodiment, the method further comprises: prior to forming the cathode layer, sequentially forming a hole injection layer and a hole transport layer in a position corresponding to the opening by a patterning process on the TFT back plate on which the pixel partitions have been formed; forming an organic light emitting layer in a position corresponding to the opening by a patterning process on the TFT back plate on which the hole transport layer has been formed; and forming an electron transport layer in a position corresponding to the opening by a patterning process on the TFT back plate on which the organic light emitting layer has been formed.

In an embodiment, the method further comprises: prior to forming the organic light emitting layer, sequentially forming a padding layer for adjusting a height of a microcavity and a buffer layer in a position corresponding to the opening by a patterning process on the TFT back plate on which the hole transport layer has been formed.

In an embodiment, the method further comprises: forming the cathode layer with at least one of metallic magnesium and metallic silver.

In another aspect of the embodiments of this disclosure, an OLED touch display panel is provided, comprising a TFT back plate and baffles and a cathode layer arranged on the TFT back plate, wherein each of the baffles defines a touch region; and wherein the cathode layer is partitioned by the baffles into a plurality of self-capacitance electrodes insulated from each other, and each of the self-capacitance electrodes is located within one of the touch regions and matches the touch region in shape.

In an embodiment, the OLED touch display panel further comprises a plurality of spacers arranged on the TFT back plate and located within the touch regions.

In yet another aspect of the embodiments of this disclosure, a touch display device is provided, comprising the above OLED touch display panel.

BRIEF DESCRIPTION OF DRAWINGS

In order to illustrate the technical solutions in the embodiments of this disclosure more clearly, drawings to be used in description of the embodiments of this disclosure will be briefly introduced below. Apparently, the drawings in the descriptions below are only some embodiments of this disclosure. For a person having ordinary skills in the art, other drawings can be further obtained from these drawings without any inventive efforts.

DETAILED DESCRIPTION OF EMBODIMENTS

The technical solutions in the embodiments of this disclosure shall be described clearly and completely as follows with reference to the drawings in the embodiments of this disclosure. Obviously, the described embodiments are only part of the embodiments of this disclosure, instead of all. Based on the embodiments in this disclosure, all other embodiments obtainable by a person having ordinary skills in the art without any inventive efforts shall fall within the protection scope of this disclosure.

REFERENCE SIGNS

10—TFT back plate; 11—baffle; 101—touch region; 102—lead region; 110a—first sub-spacer; 110b—second sub-spacer; 110—spacer; 111—via hole; 12—data lead; 13—metal thin film layer; 14—touch IC; 15—encapsulation cover plate; 16—multi layer thin film touch structure; 17—display driving chip; 20—cathode layer; 21—anode; 201—self-capacitance electrode; 202—touch lead; 30—pixel definition layer; 301—pixel partition; 302—opening; 401—hole injection layer; 402—hole transport layer, 403—organic light emitting layer; 404—electron transport layer; 405—padding layer; 406—buffer layer; 407—capping layer; 61—flexible circuit board; 62—driver IC.

The embodiments of this disclosure provide a method for manufacturing an OLED touch display panel, including a method for manufacturing a TFT back plate 10. A TFT array substrate is provided with subpixels arranged in form of a matrix. In each subpixel, it is provided a pixel driving circuit for driving a lighting device, for instance an OLED. The pixel driving circuit contains a plurality of transistors (for example, thin film transistors (TFTs)) and a storage capacitance.

Figure 1:
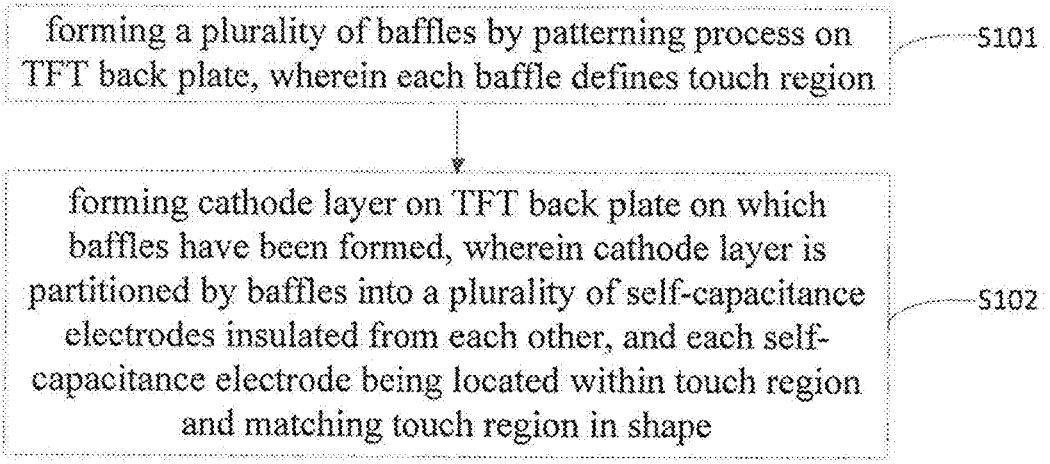
FIG. 1 is a flow chart of a method for manufacturing an OLED touch display panel provided in an embodiment of this disclosure.
Figure 2:
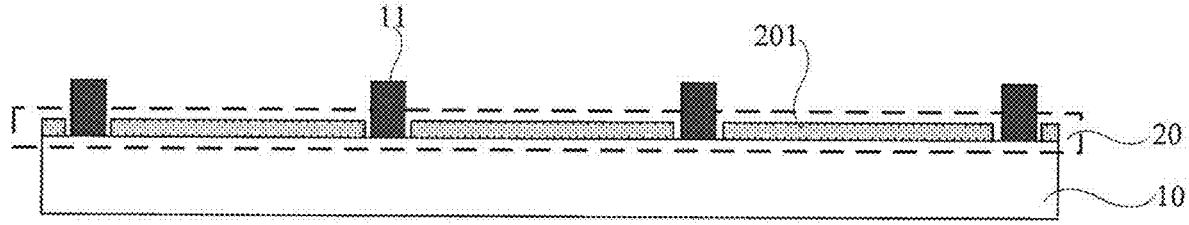
FIG. 2 is a schematic view showing a setting position of baffles made by the method of FIG. 1.
Figure 3:
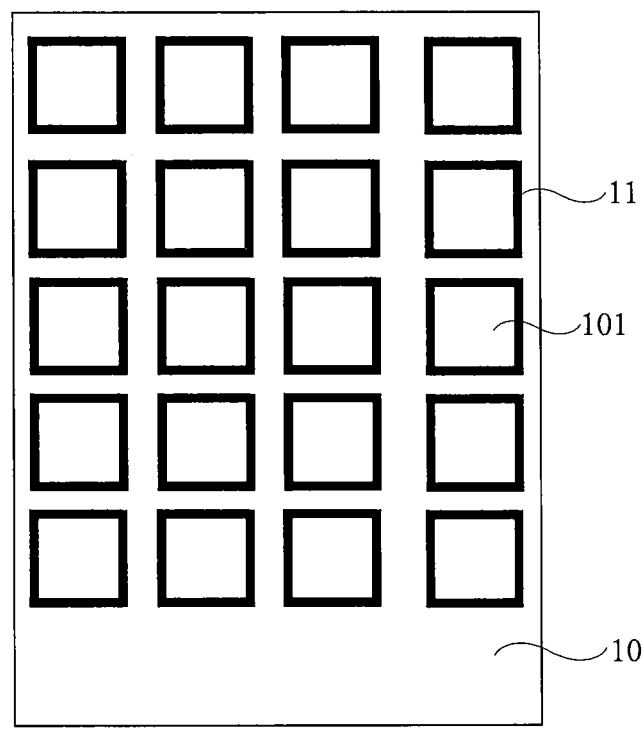
FIG. 3 is a schematic structural view of the baffles of FIG. 2.
Figure 4:
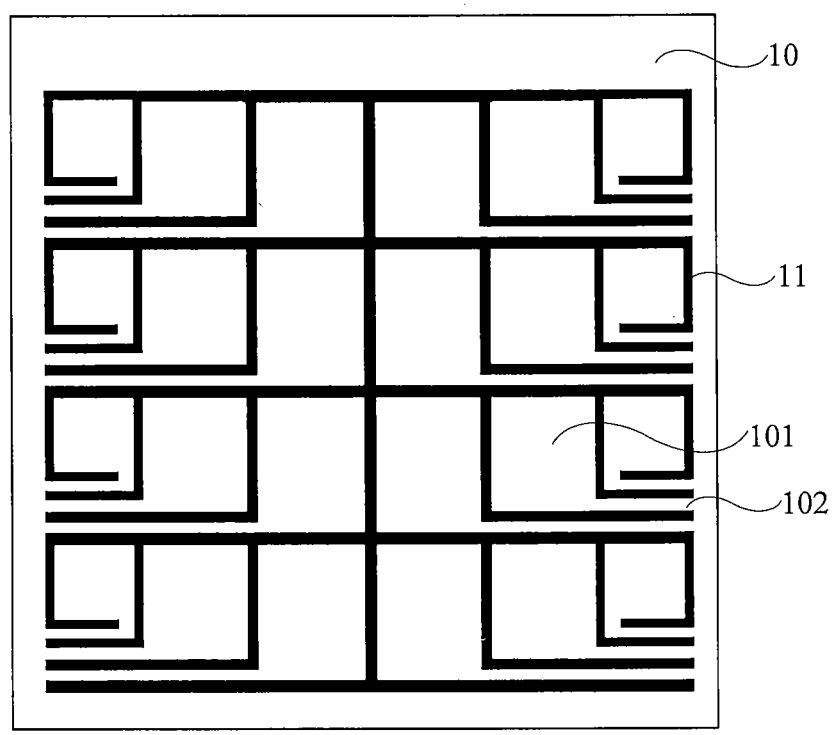
FIG. 4 is another schematic structural view of the baffles of FIG. 2.

Besides, as shown in FIG. 1, the method further comprises:

S101: forming a plurality of baffles 11 by a patterning process on the TFT back plate 10 of FIG. 2. As shown in FIG. 3 or FIG. 4, each baffle 11 defines a touch region 101.

Figure 5:
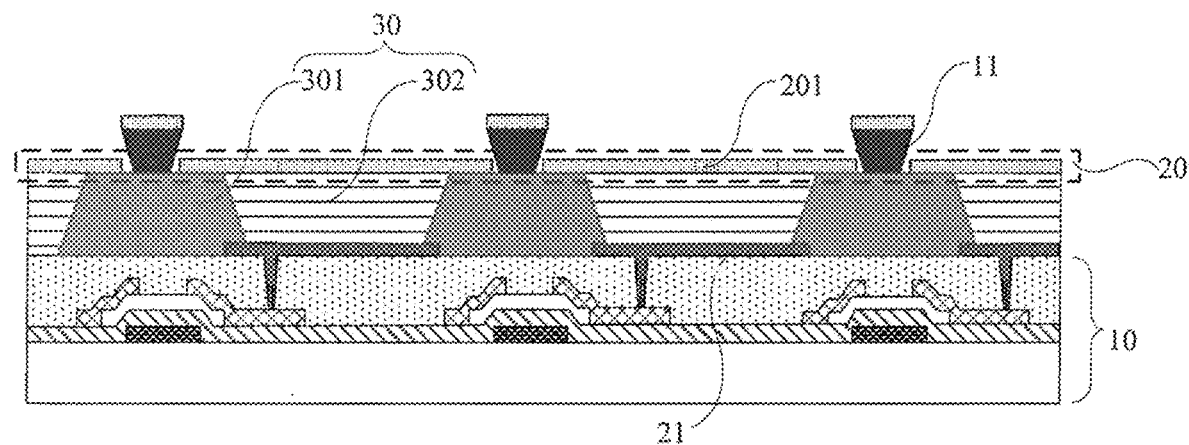
FIG. 5 is a schematic view showing another setting position of baffles made by the method of FIG. 1.

Based on that, in order to avoid influence on the display effect, for example, prior to forming the baffles 11 on the TFT back plate 10, the manufacturing method further comprises:

Forming a pixel definition layer 30 by a patterning process on the TFT back plate 10 as shown in FIG. 5. The pixel definition layer 30 comprises pixel partitions 301 crossing each other transversely and longitudinally and an opening 302 enclosed by the pixel partitions 301.

In this case, the method for forming the baffles 11 comprises: forming the baffles 11 on a side of the pixel partitions 301 facing away from the TFT back plate 10.

In this way, since the opening position 302 corresponds to an active display region of each subpixel and the pixel partitions 301 are located in a non-display region, when the baffles 11 are arranged on a side of the pixel partitions 301 facing away from the TFT back plate 10, shielding of the active display region by the baffles 11 can be avoided and thus influence on the display effect can be reduced.

S102, forming a cathode layer 20 as shown in FIG. 2 or FIG. 5 on the TFT back plate 10 on which the baffles 11 have been formed. The cathode layer 20 is partitioned by the baffles 11 into a plurality of self-capacitance electrodes 201 insulated from each other. Each self-capacitance electrode 201 is located within a touch region 101 and matching the touch region 101 in shape. To make the touching control more convenient, the plurality of self-capacitance electrodes 201 are for example arranged in the form of a matrix.

It should be noted that the contour of the touch region 101 defined by baffles 11 is not limited in the embodiments of this disclosure. FIG. 3 is an illustration taking a rectangular shape as an example. Besides, the touch regions 101 defined by the baffles 11 can be either closed regions or unclosed regions, which is not limited in the embodiments of this disclosure as long as it is ensured that the self-capacitance electrodes 201 located within different touch regions 101 are insulated from each other.

Figure 6:
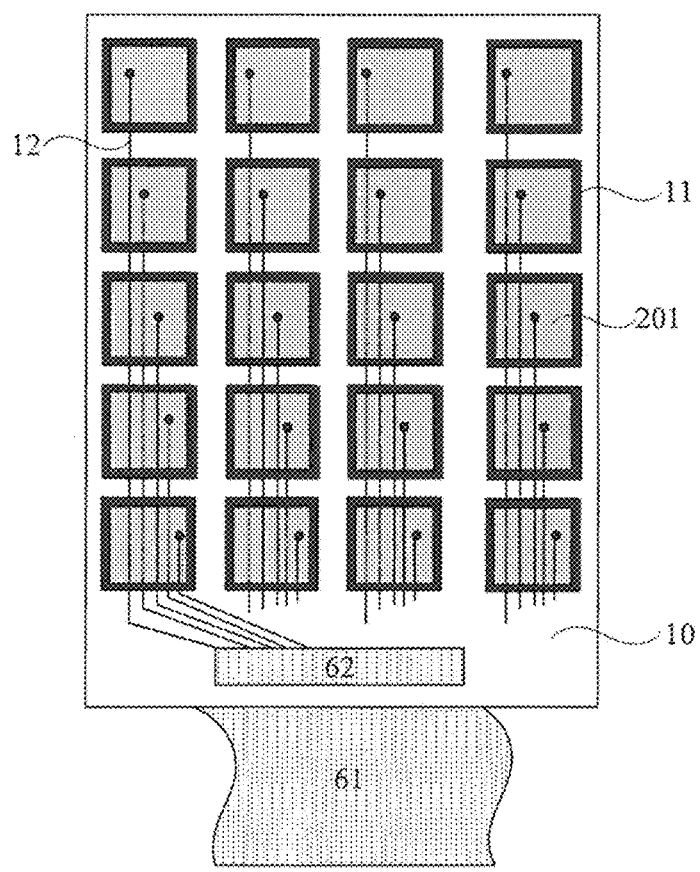
FIG. 6 is a schematic view showing the controlling manner of the self-capacitance electrodes partitioned by the baffles of FIG. 3.

Specifically, for example, when the touch regions 101 defined by the baffles 11 are closed regions as shown in FIG. 3, the formed plurality of self-capacitance electrodes 201 are shown as in FIG. 6. In this case, in order to individually detect self-capacitance generated by the each of the self-capacitance electrodes 201, a plurality of metal leads 12 can be formed on the TFT back plate and each self-capacitance electrode 201 is connected with a metal lead 12 below through a via hole. The metal leads 12 extend to a non-display region of the OLED touch display panel, the non-display region being bound with a driver IC connected with a flexible printed circuit (FPC) and the driver chip is configured for providing signals to the metal leads 12 and receiving the collection signals output from the metal leads 12.

In an alternative embodiment, when the touch regions 101 defined by the baffles 11 are unclosed regions as shown in FIG. 4, the method for forming the plurality of baffles 11 by a patterning process comprises: each baffle 11 further defining a lead region 102 connected with the touch region 101 defined by the same baffle 11. The lead region 102 extends to the non-display region of the OLED touch display panel. FIG. 4 is an illustration in which, as an example, the shape of the touch region 101 is a rectangle with a length and a width that are comparable in size, and the shape of the lead region 102 is a long and narrow rectangle.

Figure 7:
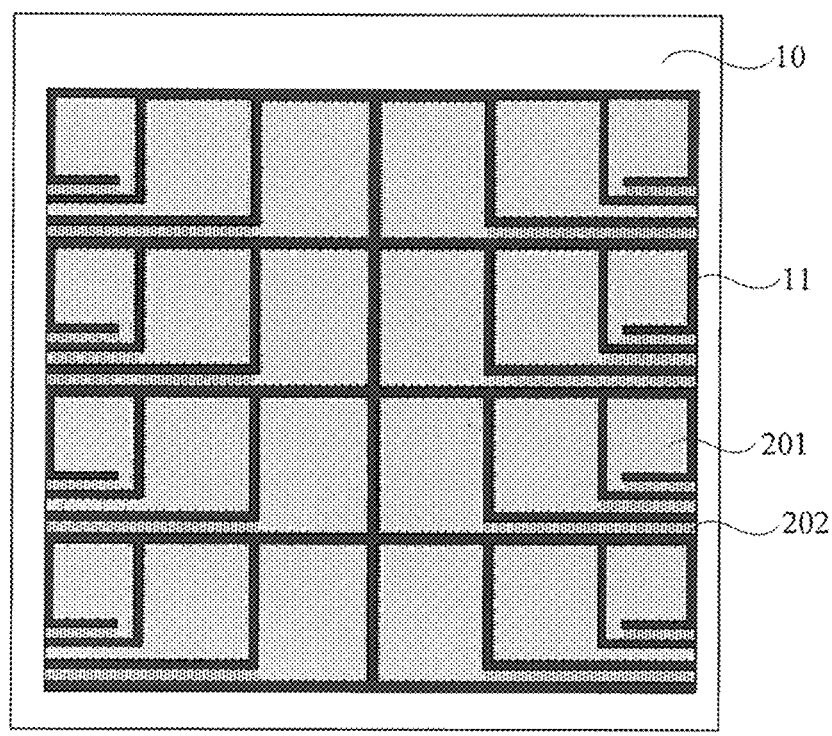
FIG. 7 is a schematic structural view of self-capacitance electrodes and touch leads partitioned by the baffles of FIG. 4.

In this case, while forming the self-capacitance electrodes 201, the method further comprises:

Partitioning the cathode layer 20 by the baffles 11 into a plurality of touch leads 202 insulated from each other, as shown in FIG. 7, wherein each of the touch leads 202 is located within one of the lead regions 102 and matches the lead region 102 in shape. The touch leads 202 partitioned by the same baffle 11 are electrically connected with the self-capacitance electrode 201.

Figure 8:
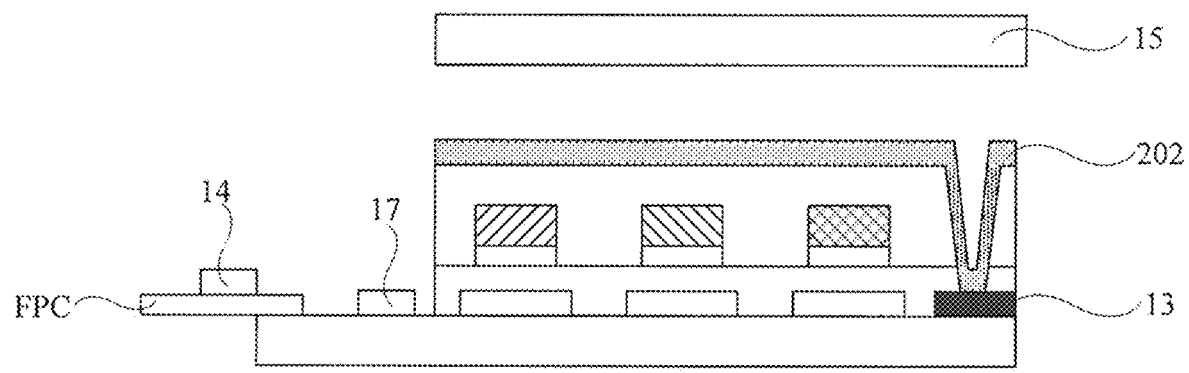
FIG. 8 is a schematic structural view showing connection of the touch leads of FIG. 7 in a non-display region.

In this way, each of the self-capacitance electrodes 201 are all connected with a touch lead 202, so it is unnecessary to form on the TFT back plate the metal leads 12 and the via hole for connecting the self-capacitance electrodes 201 with the metal leads 12, which helps to improve the aperture ratio. Based on that, since the lead region 102 extends to the non-display region of the OLED touch display panel, the touch leads 202 located within the lead regions 102 and matching the lead regions 102 in shape also extend to the non-display region of the OLED touch display panel. On this basis, as shown in FIG. 8, the plurality of touch leads 202 are connected with the metal thin film layer 13 through a via hole arranged in the non-display region of the OLED touch display panel. The metal thin film layer 13 is further connected to a grounded end or a low voltage end. Besides, the metal thin film layer 13 is also connected with a touch IC 14 arranged on the FPC. The touch IC is configured for outputting signals collected by the touch leads 202 to the touch IC 14.

Moreover, in the embodiments of this disclosure, the patterning process may only comprise a photolithography process, or comprises both a photolithography process and an etching process. Meanwhile it can further comprise other processes for forming a predetermined pattern such as printing, ink jetting and the like. The photolithography process refers to a process of forming patterns by using a photoresist, a mask plate, an exposure machine and so on, including the processes of filming, exposure and developing. Corresponding patterning processes can be selected depending on the structure formed according to this disclosure.

The one-time patterning process in the embodiments of this disclosure is illustrated with the example of forming different exposure regions by a single masking and exposure process and then etching and ashing different exposure regions to finally obtain an expected pattern.

Figure 9:
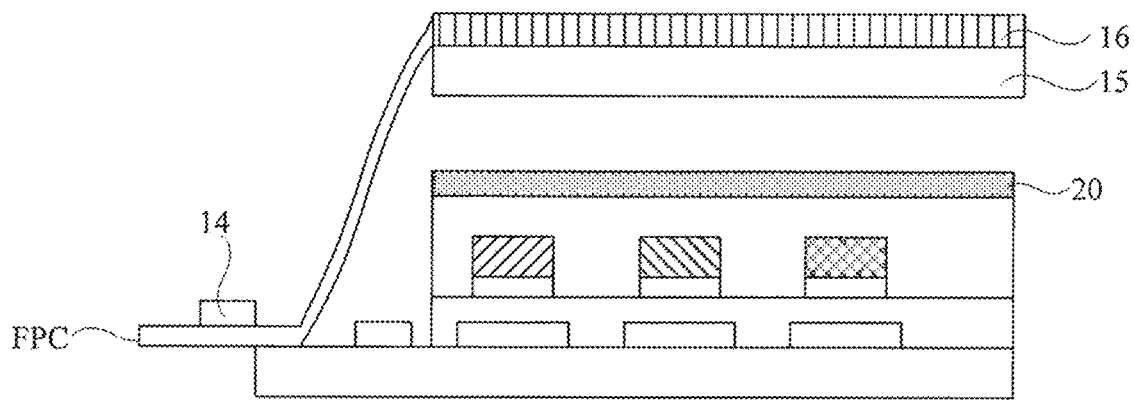
FIG. 9 is a schematic structural view of a related On-Cell touch structure.

As can be seen, in one aspect, the self-capacitance electrodes 201 are formed by partitioning the cathode layer 20 using the baffles 11. Therefore, the cathode layer 20 can be used as the self-capacitance electrodes 201. That is, when the OLED touch display panel is in a display phase, if applying a voltage to the cathode layer 20, the cathode layer 20 and an anode 21 on the TFT back plate 10 form an electric field, thereby exciting an organic light emitting layer located between the cathode layer 20 and the anode 21 as shown in FIG. 5 to emit light. When the OLED touch display panel is in a touch phase, each one of the self-capacitance electrodes 201 forms a self-capacitance with a grounded end or a low voltage end. When the plurality of self-capacitance electrodes 201 are arranged in the form of a matrix, N rows and M columns of self-capacitance electrodes 201 can be scanned (i.e., scanning is performed for (N+M) times) so as to determine a touch position according to coordinates of a self-capacitance whose capacitance value is changed. In this way, the In Cell touch structure as shown in FIG. 8 can be achieved by using the cathode layer 20 as the self-capacitance electrodes 201. Therefore, the solution of forming a multilayer thin film touch structure 16 on an outer side of an encapsulation cover plate 15 as shown in FIG. 9 is no longer necessary, so the manufacture process is simple. N and M are both positive integers greater than or equal to 2.

In another aspect, the baffles can further provide support for the encapsulation cover plate of the OLED touch display panel such that the OLED touch display panel has a flat surface.

In yet another aspect, if the material of the cathode layer 20 is a metallic material such as at least one of metallic magnesium (Mg) and metallic silver (Ag), since metals have good ductility, when the OLED touch display panel is applied to the field of flexible display, a better bending effect can be achieved, thereby solving the defect that in case a multi-layer thin film On Cell touch structure is used, it cannot satisfy the requirement of bendability for the electrode inside it is made of transparent conductive materials.

Figure 10:
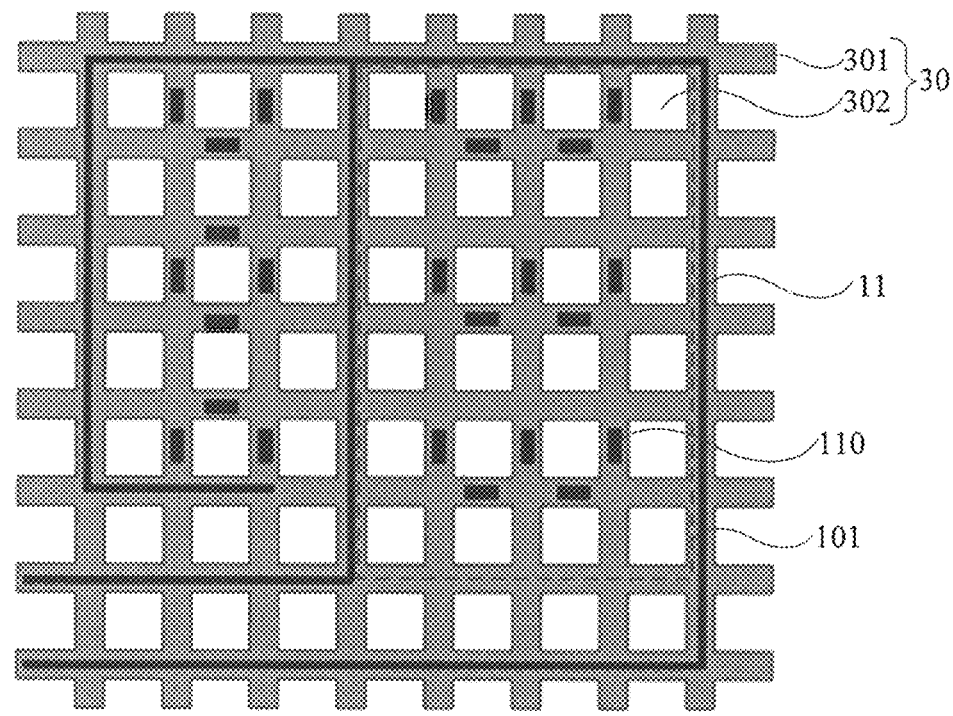
FIG. 10 is a schematic view of spacers arranged within a touch region defined by the baffle structure of FIG. 4.

It should be noted that the encapsulation cover plate 15 in the OLED touch display panel provided in the embodiments of this disclosure can be a cover plate glass or an encapsulation thin film layer. Based on that, in order to improve the support effect for the encapsulation cover plate 15, the flatness of the surface of the OLED touch display panel is further improved. For example, the OLED touch display panel further comprises a plurality of spacers 110 formed within the touch regions 101 as shown in FIG. 10. When the OLED touch display panel comprises the pixel definition layer 30, the spacers 110 can be located on a side of the pixel partitions 301 of the pixel definition layer 30 facing away from the TFT back plate 10.

Since the spacers 110 are arranged within the touch regions 101, the spacers 110 and the baffles 11 will not overlap each other.

Figure 11:
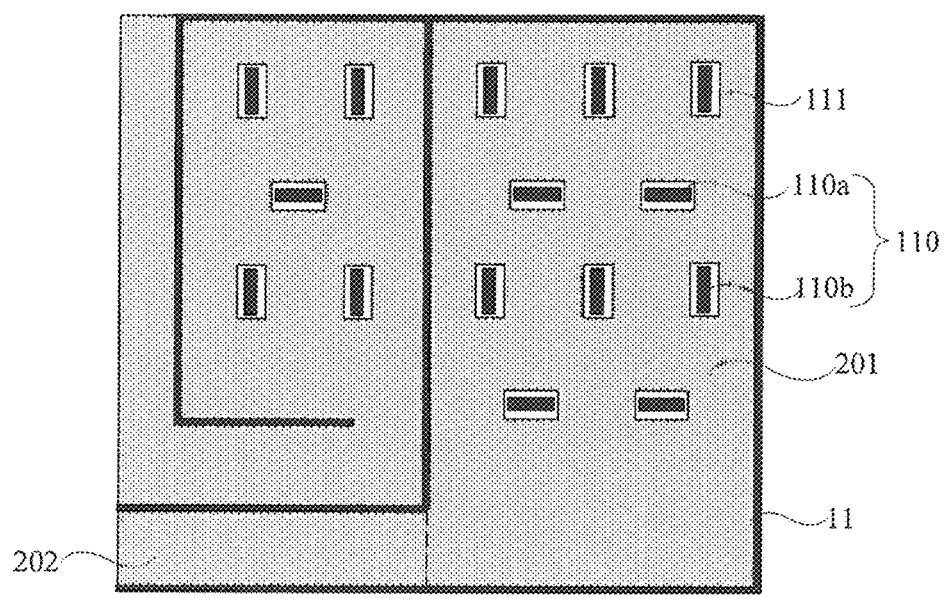
FIG. 11 is a schematic view showing distribution of the spacers of FIG. 10.

Furthermore, in order to reduce parasitic capacitances generated between the self-capacitance electrodes 201 and other electrodes on the TFT back plate 10, for example, as shown in FIG. 11, the self-capacitance electrodes 201 are provided with via holes 111 in a position corresponding to the spacers 110 with the spacers 110 passing through the via holes 111. In this way, by providing the via holes 111, an area of the self-capacitance electrodes 201 is reduced and finally the parasitic capacitances is reduced.

Based on that, in order to form the via holes 111, for example, the spacers 110 and the baffles 11 are formed by the same patterning process, and the material of the baffles 11 and the spacers 110 is negative photoresist.

Figure 12:
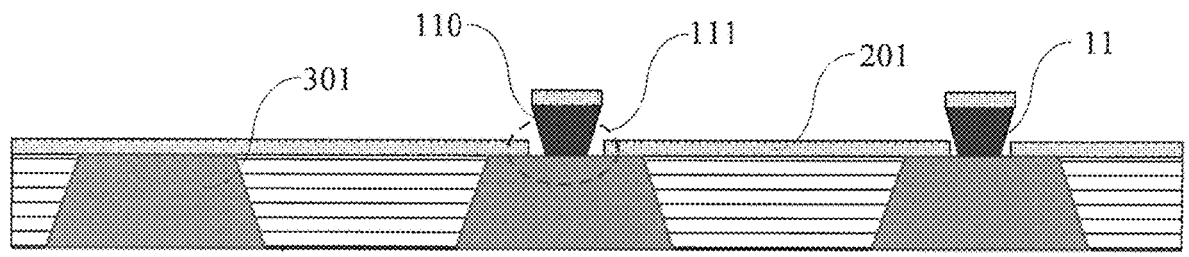
FIG. 12 is a schematic view showing formation of via holes in FIG. 11.

In this case, longitudinal cross-sections of the spacers 110 and the baffles 11 formed by a masking process (MASK) are both in the shape of an inverted trapezoid as shown in FIG. 12. In FIG. 12, a long side on a side of the inverted trapezoid away from the pixel partitions 301 of the pixel definition layer 30 is 9.633 µm, and a short side on a side close to the pixel partitions 301 is 8.508 µm. The inverted trapezoid has a height of 1.969 µm, and angles enclosed by two lateral sides and the surface of the pixel partitions 301 are respectively 67.4° (the left angle) and 76.2° (the right angle).

It should be noted that an extension direction of the longitudinal cross-section is perpendicular to the TFT back plate 10.

Besides, in the embodiments of this disclosure, directional terms such as "left" and "right" are defined with respect to the orientation of the OLED touch display panel as shown in the drawings. It should be understood that the directional terms are concepts of relativity and are used for describing and clarifying relatively and can vary correspondingly with the orientation of the OLED touch display panel.

In this case, when the cathode layer 20 is formed on a substrate on which the spacers 110 and the baffles 11 have been formed, for example, when a MgAg alloy thin film layer is formed by an evaporation process, the cathode layer 20 can be cut under the cutting effect of the angles enclosed between the long sides and the lateral sides of the baffles 11 and the spacers 110, thereby forming the self-capacitance electrodes 201 on respective sides of the baffles 11 and forming the via holes 111 on the periphery of the spacers 110. Moreover, a floating thin film layer is provided on surfaces of the baffles 11 and the spacers 110. Since the thin film layer is in the shape of an isolated island, it has a smaller influence on the OLED touch display panel.

Based on that, in order to further reduce the parasitic capacitances generated between the self-capacitance electrodes 201 and other electrodes on the TFT back plate 10, the number of the spacers 110 within the touch regions 101 can be increased, and the arrangement of the spacers 110 can be optimized.

Specifically, a plurality of first sub-spacers 110a and a plurality of second sub-spacers 110b as shown in FIG. 11 are formed on the TFT back plate 10 and within the touch regions 101. It will be understood that, although the terms first, second, third, etc. may be used herein to describe various elements, elements should not be limited by these terms; rather, these terms are only used to distinguish one element from another element. Thus, a first element discussed below could be termed a second element without departing from the scope of the present inventive concepts. As used herein, the term "and/or" includes any and all combinations of one or more of the associated listed items. Expressions such as "at least one of," when preceding a list of elements, modify the entire list of elements and do not modify the individual elements of the list.

The plurality of first sub-spacers 110a is arranged in the form of a matrix. The second sub-spacers 110b are located between two adjacent rows and two adjacent columns of first sub-spacers 110a. An extension direction of the first sub-spacers 110a is perpendicular to an extension direction of the second sub-spacers 110b. In this way, more thin film layer in a floating state may be added within the touch regions 101 such that the area of the self-capacitance electrodes 201 is further reduced.

Besides, since the spacers 110 and the baffles 11 are formed in the same patterning process, for a process flow for manufacturing a Full In Cell (FIC) OLED touch display panel, i.e., an AMOLED FIC process flow, no other process flow is added. The above AMOLED FIC manufacture process is shown in table 1.

TABLE 1

| Thin film layer | Material | Thickness (Angstrom) |
| --- | --- | --- |
| Buffer layer (Buffer) | SiN$_x$ | 1000 ± 70 |
| | SiO$_2$ | 3000 ± 210 |
| Active layer (Poly) | P—Si | 500 ± 25 |
| Gate insulating layer (GI) | SiO$_2$ | 800 ± 56 |
| | SiN$_x$ | 400 ± 28 |
| Gate metal layer 1 (Gate 1) | Mo | 24000 |
| Capacitance (Cst) dielectric layer | SiN$_x$ | — |
| Gate metal layer 2 (Gate 2) | Mo | — |
| Insulating layer (ILD) | SiO$_2$ | 3000 ± 210 |
| | SiN$_x$ | 2000 ± 140 |
| Data meta layer (SD) | TI/AL/TI | 300/4000/500 |
| Planarization layer (PLN) | Positive photoresist (PI-PR) | 20000 |
| Anode (AND) | ITO/AL/ITO | 70/1000/70 |
| Pixel definition layer (PDL) | Positive photoresist (PI-PR) | 15000 |
| Spacer | Negative photoresist | 15000 |
| Baffle | Negative photoresist | 18000 |

In the above process, only the buffer layer (Buffer), the gate insulating layer (GI) and the capacitance (Cst) dielectric layer does not require MASK process, and the spacers 110 and the baffles 11 are formed by the same patterning process, so even though the above baffles 11 are provided in the embodiments of this disclosure, the entire AMOLED FIC process flow requires same number of MASK processes and no more MASK processes are added. Therefore, for those skilled in the art, the AMOLED FIC process is easy to operate.

Based on the above process flow, after the spacers 110 and the baffles 11 located on the pixel partitions 301 of the pixel definition layer 30 have been formed, prior to the manufacture of the cathode layer 20, the method for manufacturing an OLED touch display panel further comprises forming an organic material function layer at least in the opening of the pixel definitional layer 30.

The method for manufacturing the organic material function layer will be illustrated below.

Figure 13:
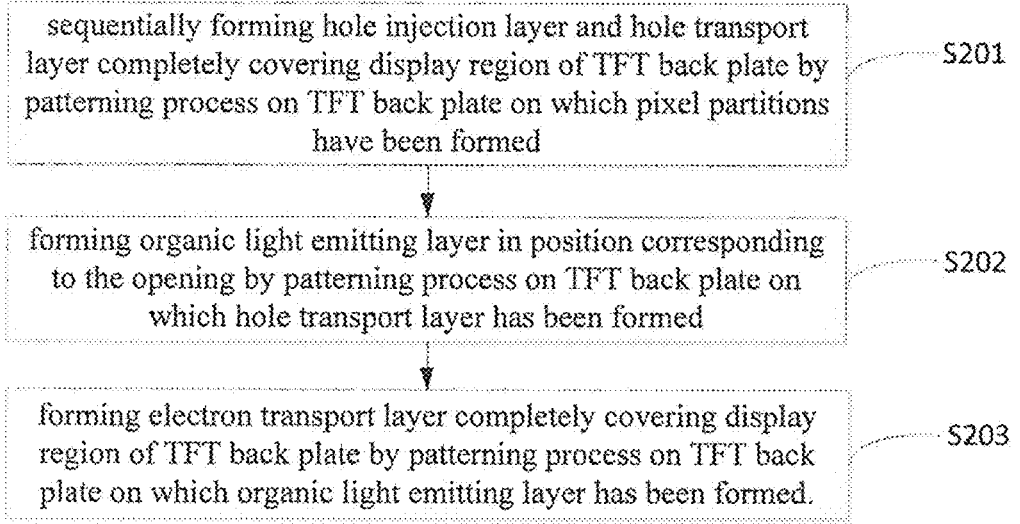
FIG. 13 is a flow chart of a method for manufacturing an organic material functional layer provided in an embodiment of this disclosure.

For example, as shown in FIG. 13, the method for manufacturing the organic material functional layer comprises steps S201, S202 and S203.

Figure 14:
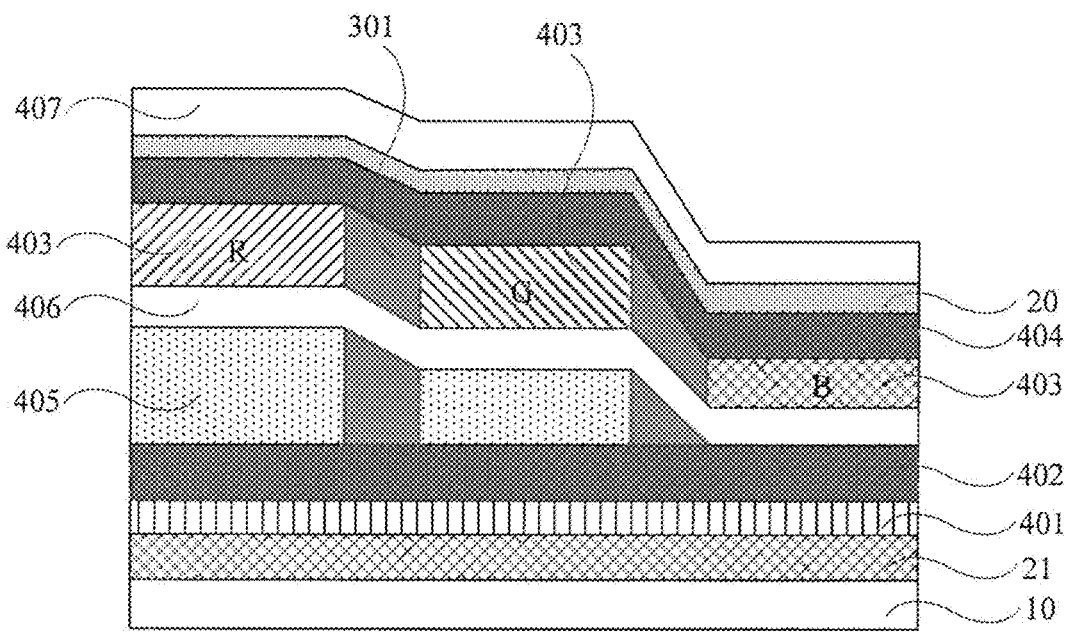
FIG. 14 is a schematic structural view of the organic material functional layer of a plurality of OLED devices manufactured by the method showing in FIG. 13.

S201, sequentially forming on the TFT back plate 10 on which the pixel partitions 301 is formed a hole injection layer 401 (HI) and a hole transport layer 402 (HT) completely covering a display region of the TFT back plate 10 by a patterning process, as shown in FIG. 14. The hole injection layer 401 and the hole transport layer 402 have a thickness of 50 Angstroms and 1140 Angstroms respectively.

In order to facilitate the illustration, the pixel partitions 301 covered by the hole injection layer 401 and the hole transport layer 402 are not shown in FIG. 14.

S202, forming on the TFT back plate 10 on which the hole transport layer 401 has been formed an organic light emitting layer 403 (EML) in a position corresponding to the opening 302 by a patterning process. When the materials for forming the organic light emitting layer 403 are different, under the excitation effect of an electric field formed by the anode 21 and the cathode layer 20, different light rays can be emitted, including, for example, red light (R), green light (G) and blue light (B).

The red (R) organic light emitting layer 403, the green (G) organic light emitting layer 40 and the blue (B) organic light emitting layer 403 have a thickness of 400 Angstroms, 200 Angstroms and 250 Angstroms respectively.

S203, forming on the TFT back plate on which the organic light emitting layer 403 has been formed an electron transport layer 404 (ET) completely covering the display region of the TFT back plate 10 by a patterning process, the electron transport layer 404 having a thickness of 300 Angstroms.

Furthermore, prior to forming the organic light emitting layer 403, the method for manufacturing the organic material functional layer further comprises:

forming on the TFT back plate on which the hole transport layer 402 has been formed a padding layer 405 for adjusting a height of a microcavity in a position corresponding to the opening 302 by a patterning process.

FIG. 4 is an illustration taking an example of the adjustment of the heights of the microcavities where the red (R) organic light emitting layer 403 and the green (G) organic light emitting layer 40 are located. When the height of the microcavity where the blue (B) organic light emitting layer 403 is located needs to be adjusted, the padding layer 405 can be formed in an opening position corresponding to the microcavity where the blue (B) organic light emitting layer 403 is located. Specifically, the padding layers 405 for adjusting the heights of the microcavities where the red (R) organic light emitting layer 403 and the green (G) organic light emitting layer 40 are located have a thickness of 730 Angstroms and 400 Angstroms respectively.

Besides, a buffer layer 406 (HTEB) completely covering the display region of the TFT back plate 10 is formed by a patterning process on the TFT back plate 10 on which the padding layer 405 has been formed. The buffer layer 406 can be used for improving the transport efficiency of the holes. The buffer layer 406 can have a thickness of 100 Angstroms.

As known from above, when the organic material functional layer is formed by the method of FIG. 13, only the organic light emitting layer 403 and the padding layer 405 correspond to the position of the opening 302, and the remaining thin film layer all covers the display region of the TFT back plate 10. Therefore, the organic light emitting layer 403 and the padding layer 405 can be formed by using a fine metal mask (FMM). The remaining thin film layer can simply use an ordinary mask plate. As a result, the number of FMMs can be reduced and the manufacture costs can be lowered.

Figure 15:
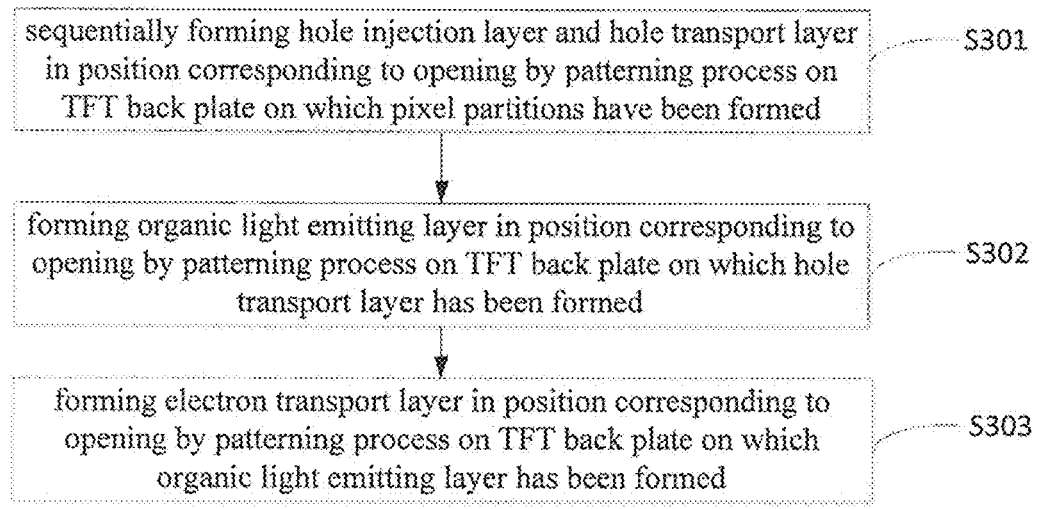
FIG. 15 is a flow chart of another method for manufacturing an organic material functional layer provided in an embodiment of this disclosure.

As another example, as shown in FIG. 15, the method for manufacturing the organic material functional layer comprises steps of S301, S302 and S303.

Figure 16:
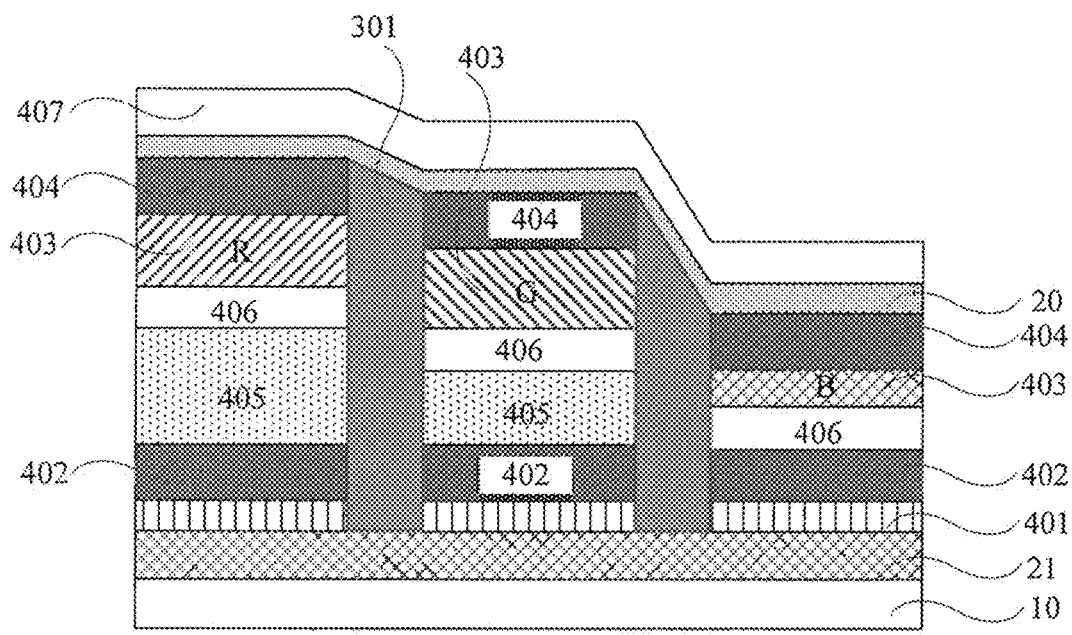
FIG. 16 is a schematic structural view of the organic material functional layer of a plurality of OLED devices manufactured by the method showing in FIG. 15.

S301, sequentially forming on the TFT back plate on which the pixel partitions 301 have been formed a hole injection layer 401 and a hole transport layer 402 in a position corresponding to the opening 302 by a patterning process as shown in FIG. 16.

S302, forming on the TFT back plate 10 on which the hole transport layer 402 has been formed an organic light emitting layer 403 in a position corresponding to the opening 302 by a patterning process.

S303, forming on the TFT back plate 10 on which the organic light emitting layer 403 has been formed an electron transport layer 404 in a position corresponding to the opening 302 by a patterning process.

Furthermore, prior to forming the organic light emitting layer 403, the method for manufacturing the organic material functional layer further comprises:

Sequentially forming on the TFT back plate on which the hole transport layer 402 has been formed a padding layer 405 for adjusting a height of a microcavity and a buffer layer 406 in a position corresponding to the opening 302 by a patterning process.

To sum up, as compared with each other, the two methods for manufacturing an organic material functional layer provided in FIG. 13 and FIG. 15 are both applicable to the scheme of arrangement of the baffles 11 as shown in FIG. 4, i.e., the baffles 11 define both the touch regions 101 and the lead regions 102 connected with the touch regions 101. In this case, as shown in FIG. 7, the touch leads 202 and the self-capacitance electrodes 201 are structures in a same layer, so no matter whether structures of each OLED device are independent by themselves, the touch leads 202 can transmit signals to the self-capacitance electrodes 201, thereby enabling the OLED devices to operate normally. Apparently, in order to simplify the manufacture process and save costs, the manufacture method as shown in FIG. 13 is often chosen.

Besides, for the scheme of arrangement of the baffles 11 as shown in FIG. 3, since the baffles 11 only define the touch regions 101, as shown in FIG. 6, each self-capacitance electrode 201 needs to be connected through via holes with data leads 12 located on the TFT back plate 10. In this case, the structures of each OLED device need to be independent. Therefore, the method for manufacturing an organic material functional layer as shown in FIG. 15 needs to be adopted.

Based on that, after the organic material functional layer has been manufactured, a step of evaporating the cathode layer 20 is executed, wherein the cathode layer 20 can have a thickness of 158 Angstroms. Moreover, a capping layer 407 can be further formed on the surface of the cathode layer 20 so as to improve the electric performance of the cathode layer 20. The capping layer 407 can have a thickness of 550 Angstroms.

The embodiments of this disclosure provide an OLED touch display panel, comprising a TFT back plate 10 and baffles 11 and a cathode layer 20 arranged on the TFT back plate 10, as shown in FIG. 5.

As shown in FIG. 3 or FIG. 4, each baffle 11 defines a touch region 101. As shown in FIG. 6 or 7, the cathode layer 20 is partitioned by the baffles 11 into a plurality of self-capacitance electrodes 201 insulated from each other, with each self-capacitance electrode 201 being located within a touch region 101 and matching the touch region 101 in shape.

In addition, the OLED touch display panel further comprises a plurality of spacers 110 formed within the touch regions 101 as shown in FIG. 10.

Based on that, as shown in FIG. 8, the OLED touch display panel further comprises an encapsulation cover plate 15. The encapsulation cover plate 15 can be a cover plate glass or an encapsulation thin film layer, which will not be limited in this disclosure.

The OLED touch display panel provided in the embodiments of this disclosure has the same structures and beneficial effects as an OLED touch display panel obtained from the method for manufacturing an OLED touch display panel provided in the above embodiments. The structures and beneficial effects will not be repeated herein they have been illustrated in the above embodiments. Besides, it was found by the inventor from many experiments that the OLED touch display panel provided in the embodiments of this disclosure can completely achieve the function of one-finger lineation and the function of multi-finger touch control, and hence has a good touch control effect.

The embodiments of this disclosure provide a touch display device, comprising the above OLED touch display panel, and can achieve the same beneficial effects as the OLED touch display panel provided in the above embodiments.

Besides, as shown in FIG. 8, the touch display device further comprises driving parts or driving circuits such as FPC, touch IC 14 and display driving chip 17, which is arranged in the non-display region of the OLED touch display panel.

It should be noted that, in the embodiments of this disclosure the touch display device can be any product or component having a display function, such as a television, a digital photo frame, a cellphone or a tablet computer.

The embodiments of this disclosure provide an OLED touch display panel, a method for manufacturing an OLED touch display panel and a touch display device. The method comprises: forming a plurality of baffles on a TFT back plate by a patterning process, wherein each of the baffles defines a touch region; and forming a cathode layer on the TFT back plate on which the baffles have been formed. The cathode layer is partitioned by the baffles into a plurality of self-capacitance electrodes insulated from each other. Each of the self-capacitance electrodes is located within one of the touch regions and matches the touch region in shape.

On the one hand, the self-capacitance electrodes are formed by partitioning the cathode layer with the baffles. Therefore, the cathode layer can be used as the self-capacitance electrodes. That is, when the OLED touch display panel is in a display phase, a voltage is applied to the cathode layer such that the cathode layer and an anode on the TFT back plate form an electric field, thereby exciting an organic light emitting layer located between the cathode layer and the anode to emit light. When the OLED touch display panel is in a touch phase, a grounded end or a low voltage end and each of the self-capacitance electrodes form a self-capacitance. When the plurality of self-capacitance electrodes are arranged in the form of a matrix, N rows and M columns of self-capacitance electrodes can be scanned so as to determine a touch position according to coordinates of a self-capacitance whose capacitance value is changed. In this way, the In-Cell touch structure can be achieved by using the cathode layer as the self-capacitance electrodes. Therefore, the solution of forming a multi-layer thin film touch structure on an outer side of an encapsulation cover plate is not required, so the manufacture process is simple. In another aspect, the baffles can further provide support for the encapsulation cover plate in the OLED touch display panel such that the OLED touch display panel has a flat surface.

The disclosure mentioned above is only specific embodiments of this disclosure, but the protection scope of this disclosure shall not be limited thereto. Any variation or substitution that can be easily conceivable by the skilled person within the technical range disclosed in this disclosure shall fall within the protection scope of this disclosure. Therefore, the protection scope of this disclosure shall be subject to the protection scope of the claims.

We claim:

1. A method for manufacturing an Organic Light Emitting Diode (OLED) touch display panel, comprising:
    forming a plurality of baffles by a patterning process using negative photoresist on a Thin Film Transistor (TFT) back plate, wherein ones of the plurality of the baffles define respective touch regions;
    forming, on the TFT back plate, a plurality of spacers located within the touch regions by the patterning process using negative photoresist, wherein the plurality of spacers comprises a plurality of first sub-spacers and a plurality of second sub-spacers located within the touch regions; and
    forming a cathode layer on the TFT back plate on which the baffles have been formed,
    wherein the cathode layer is partitioned by the baffles into a plurality of self-capacitance electrodes insulated from each other,
    wherein each of the self-capacitance electrodes is within a respective one of the touch regions and matches the respective one of the touch regions in shape,
    wherein the first sub-spacers are arranged in a form of a matrix, and the second sub-spacers are located between two adjacent rows and two adjacent columns of first sub-spacers, and
    wherein an extension direction of the first sub-spacers is perpendicular to an extension direction of the second sub-spacers.

2. The method for manufacturing the OLED touch display panel according to claim 1, further comprising:
    forming a via hole in a position in a first one of the self-capacitance electrodes corresponding to a first spacer of the plurality of spacers,
    wherein the first spacer passes through the via hole.

3. The method for manufacturing the OLED touch display panel according to claim 1, wherein forming the plurality of baffles by the patterning process further comprises:
    defining for ones of the baffles corresponding ones of a plurality of lead regions connected with a corresponding one of the touch regions defined by a corresponding baffle of the plurality of baffles,
    wherein at least one of the lead regions extends to a non-display region of the OLED touch display panel.

4. The method for manufacturing the OLED touch display panel according to claim 3, further comprising:
    partitioning the cathode layer into a plurality of touch leads insulated from each other by the baffles while forming the self-capacitance electrodes,
    wherein each of the touch leads is located within and matches in shape one of the lead regions, and
    wherein ones of the touch leads partitioned by the corresponding baffle are electrically connected with a corresponding self-capacitance electrode of the plurality of self-capacitance electrodes.

5. The method for manufacturing the OLED touch display panel according to claim 4, further comprising:
   prior to forming the plurality of baffles on the TFT back plate, forming a pixel definition layer on the TFT back plate by a patterning process,
   wherein the pixel definition layer comprises pixel partitions crossing each other transversely and longitudinally and an opening enclosed by the pixel partitions.

6. The method for manufacturing the OLED touch display panel according to claim 5, wherein the forming the plurality of baffles comprises:
   forming the plurality of baffles on a side of the pixel partitions facing away from the TFT back plate.

7. The method for manufacturing the OLED touch display panel according to claim 6, further comprising:
   prior to forming the cathode layer, sequentially forming a hole injection layer and a hole transport layer completely covering a display region of the TFT back plate by a patterning process on the TFT back plate on which the pixel partitions have been formed;
   forming an organic light emitting layer in a position corresponding to the opening by a patterning process on the TFT back plate on which the hole transport layer has been formed; and
   forming an electron transport layer completely covering the display region of the TFT back plate by a patterning process on the TFT back plate on which the organic light emitting layer has been formed.

8. The method for manufacturing the OLED touch display panel according to claim 7, further comprising:
   prior to forming the organic light emitting layer, forming a padding layer for adjusting a height of a microcavity in a position corresponding to the opening by a patterning process on the TFT back plate on which the hole transport layer has been formed; and
   forming a buffer layer completely covering the display region of the TFT back plate by a patterning process on the TFT back plate on which the padding layer has been formed.

9. The method for manufacturing the OLED touch display panel according to claim 5, further comprising:
   prior to forming the cathode layer, sequentially forming a hole injection layer and a hole transport layer in a position corresponding to the opening by a patterning process on the TFT back plate on which the pixel partitions have been formed;
   forming an organic light emitting layer in a position corresponding to the opening by a patterning process on the TFT back plate on which the hole transport layer has been formed; and
   forming an electron transport layer in a position corresponding to the opening by a patterning process on the TFT back plate on which the organic light emitting layer has been formed.

10. The method for manufacturing the OLED touch display panel according to claim 9, further comprising:
   prior to forming the organic light emitting layer, sequentially forming a padding layer for adjusting a height of a microcavity and a buffer layer in a position corresponding to the opening by a patterning process on the TFT back plate on which the hole transport layer has been formed.

11. The method for manufacturing the OLED touch display panel according to claim 1, further comprising:
   forming the cathode layer with at least one of metallic magnesium or metallic silver.

12. An Organic Light Emitting Diode (OLED) touch display panel, comprising:
   a Thin Film Transistor (TFT) back plate;
   a plurality of baffles, wherein each of the plurality of baffles defines a corresponding touch region of a plurality of touch regions;
   a plurality of spacers arranged on the TFT back plate and located within the touch regions, wherein the plurality of spacers comprises a plurality of first sub-spacers and a plurality of second sub-spacers located within the touch regions, wherein the first sub-spacers are arranged in a form of a matrix, and the second sub-spacers are located between two adjacent rows and two adjacent columns of first sub-spacers, and wherein an extension direction of the first sub-spacers is perpendicular to an extension direction of the second sub-spacers; and
   a cathode layer arranged on the TFT back plate,
   wherein the cathode layer is partitioned by the baffles into a plurality of self-capacitance electrodes insulated from each other, and
   wherein each of the self-capacitance electrodes is located within a respective one of the touch regions and matches the one of the touch regions in shape.

13. A touch display device comprising the OLED touch display panel according to claim 12.

14. A touch display device comprising the OLED touch display panel according to claim 12.

* * * * *